(12) United States Patent
Hu et al.

(10) Patent No.: US 10,867,688 B2
(45) Date of Patent: Dec. 15, 2020

(54) SHIFT REGISTER, METHOD OF DRIVING SHIFT REGISTER, GATE DRIVING CIRCUIT AND DISPLAY DEVICE

(71) Applicants: HEFEI BOE DISPLAY TECHNOLOGY CO., LTD., Hefei (CN); BOE TECHNOLOGY GROUP CO., LTD., Beijing (CN)

(72) Inventors: Zuquan Hu, Beijing (CN); Peng Jiang, Beijing (CN); Ke Dai, Beijing (CN)

(73) Assignees: HEFEI BOE DISPLAY TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/552,048

(22) Filed: Aug. 27, 2019

(65) Prior Publication Data

US 2020/0202967 A1    Jun. 25, 2020

(30) Foreign Application Priority Data

Dec. 25, 2018 (CN) .......................... 2018 1 1592396

(51) Int. Cl.
*G11C 19/28* (2006.01)
*G09G 3/20* (2006.01)

(52) U.S. Cl.
CPC .......... *G11C 19/28* (2013.01); *G09G 3/2092* (2013.01); *G09G 2300/0408* (2013.01); *G09G 2300/0417* (2013.01); *G09G 2300/0426* (2013.01); *G09G 2310/0267* (2013.01); *G09G 2310/0281* (2013.01); *G09G 2310/08* (2013.01); *G09G 2330/021* (2013.01)

(58) Field of Classification Search
CPC ... G09G 2300/0408; G09G 2300/0417; G09G 2300/0426; G09G 2310/0267; G09G 2310/0281; G09G 2310/08; G09G 2330/021; G09G 3/2092; G09G 3/3266; G09G 3/3677; G11C 19/28; G11C 19/184; G11C 19/186; G11C 19/285
See application file for complete search history.

(56) References Cited

U.S. PATENT DOCUMENTS

| | | | | |
|---|---|---|---|---|
| 2004/0239608 A1* | 12/2004 | Chung | ................ | G11C 19/285 345/100 |
| 2010/0177023 A1* | 7/2010 | Han | ..................... | G11C 19/184 345/76 |
| 2016/0019976 A1* | 1/2016 | Pai | ....................... | G09G 3/3266 345/204 |
| 2017/0301279 A1* | 10/2017 | Lee | ....................... | G09G 3/3677 |
| 2017/0330633 A1* | 11/2017 | Sun | ...................... | G11C 19/186 |

* cited by examiner

*Primary Examiner* — Richard J Hong

(57) ABSTRACT

A shift register, a method of driving a shift register, a gate driving circuit and a display device are disclosed. The shift register includes an input circuit, a first output circuit and a second output circuit. The input circuit is connected to a first node and is configured to control a level of the first node in response to an input signal. The first output circuit is connected to the first node, a first output terminal and a third output terminal, and is configured to transmit a received clock signal to the first output terminal and the third output terminal in response to the level of the first node. The second output circuit is connected to the first node, a first voltage terminal, a second voltage terminal and a second node.

20 Claims, 7 Drawing Sheets

SHIFT REGISTER, METHOD OF DRIVING SHIFT REGISTER, GATE DRIVING CIRCUIT AND DISPLAY DEVICE

CROSS-REFERENCE TO RELATED APPLICATION

The present application claims priority of Chinese Patent Application No. 201811592396.8, filed on Dec. 25, 2018, the disclosure of which is incorporated herein by reference in its entirety as part of the present application.

TECHNICAL FIELD

Embodiments of the present disclosure relate to a shift register, a method of driving a shift register, a gate driving circuit and a display device.

BACKGROUND

With the development of display technology, more and more active matrix organic light emitting diode (AMOLED) displays enter the market. Compared with traditional thin film transistor liquid crystal displays (TFT LCD), the AMOLED displays have a faster reaction speed, a higher contrast, a wider viewing angle and a thinner module. Thus, the AMOLED displays have attracted more and more attention from manufacturers. For AMOLED pixel circuits with current compensation, in addition to a data signal, it is generally necessary to provide two driving signals, one of which is usually provided by a gate driving circuit, while the other of which needs to be provided by an independent signal line arranged additionally other than the gate driving circuit.

SUMMARY

At least one embodiment of the present disclosure provides a shift register, which includes an input circuit, a first output circuit and a second output circuit. The input circuit is connected to a first node and is configured to control a level of the first node in response to an input signal. The first output circuit is connected to the first node, a first output terminal and a third output terminal, and is configured to transmit a received clock signal to the first output terminal and the third output terminal in response to the level of the first node. The second output circuit is connected to the first node, a first voltage terminal, a second voltage terminal and a second node, and is configured to transmit a first level of the first voltage terminal to the second node and a second output terminal in response to the level of the first node, and to transmit a second level of the second voltage terminal to the second node and the second output terminal in response to the level of the first node, and the second node is connected to the second output terminal.

For example, the shift register provided by an embodiment of the present disclosure further includes a control circuit. The control circuit is connected to the first node, the second node, the first voltage terminal, the first output terminal, and the third output terminal, and is configured to transmit the first level of the first voltage terminal to the first node, the first output terminal, and the third output terminal in response to a level of the second node.

For example, the shift register provided by an embodiment of the present disclosure further includes a reset circuit. The reset circuit is connected to the first voltage terminal, the first node, and the first output terminal, and is configured to transmit the first level of the first voltage terminal to the first node and the first output terminal in response to a reset signal.

For example, in the shift register provided by an embodiment of the present disclosure, the second output circuit includes a seventh transistor, an eighth transistor, a ninth transistor, and a tenth transistor. A control electrode of the seventh transistor and a first electrode of the seventh transistor are both connected to the second voltage terminal. A control electrode of the eighth transistor is connected to a second electrode of the seventh transistor, a first electrode of the eighth transistor is connected to the second voltage terminal, and a second electrode of the eighth transistor is connected to the second node. A control electrode of the ninth transistor is connected to the first node, a first electrode of the ninth transistor is connected to the second electrode of the seventh transistor, and a second electrode of the ninth transistor is connected to the first voltage terminal. And a control electrode of the tenth transistor is connected to the first node, a first electrode of the tenth transistor is connected to the second node, and a second electrode of the tenth transistor is connected to the first voltage terminal.

For example, in the shift register provided by an embodiment of the present disclosure, the first output circuit includes a third transistor, an eleventh transistor, and a first capacitor. A control electrode of the third transistor is connected to the first node, a first electrode of the third transistor is connected to a clock terminal for receiving the clock signal, and a second electrode of the third transistor is connected to the first output terminal. A control electrode of the eleventh transistor is connected to the first node, a first electrode of the eleventh transistor is connected to the clock terminal for receiving the clock signal, and a second electrode of the eleventh transistor is connected to the third output terminal. And a first terminal of the first capacitor is connected to the first node, and a second terminal of the first capacitor is connected to the first output terminal.

For example, in the shift register provided by an embodiment of the present disclosure, the input circuit includes a first transistor. A control electrode of the first transistor and a first electrode of the first transistor are respectively connected to an input terminal for receiving the input signal, and a second electrode of the first transistor is connected to the first node.

For example, in the shift register provided by an embodiment of the present disclosure, the control circuit includes a fifth transistor, a sixth transistor, and a twelfth transistor. A control electrode of the fifth transistor is connected to the second node, a first electrode of the fifth transistor is connected to the first node, and a second electrode of the fifth transistor is connected to the first voltage terminal. A control electrode of the sixth transistor is connected to the second node, a first electrode of the sixth transistor is connected to the first output terminal, and a second electrode of the sixth transistor is connected to the first voltage terminal. And a control electrode of the twelfth transistor is connected to the second node, a first electrode of the twelfth transistor is connected to the third output terminal, and a second electrode of the twelfth transistor is connected to the first voltage terminal.

For example, in the shift register provided by an embodiment of the present disclosure, the reset circuit includes a second transistor and a fourth transistor. A control electrode of the second transistor is connected to a reset terminal for receiving the reset signal, a first electrode of the second transistor is connected to the first node, and a second electrode of the second transistor is connected to the first voltage terminal. And a control electrode of the fourth transistor is connected to the reset terminal for receiving the reset signal, a first electrode of the fourth transistor is connected to the first output terminal, and a second electrode of the fourth transistor is connected to the first voltage terminal.

For example, in the shift register provided by an embodiment of the present disclosure, the input circuit includes a first transistor. A control electrode of the first transistor and a first electrode of the first transistor are respectively connected to an input terminal for receiving the input signal, and a second electrode of the first transistor is connected to the first node. The first output circuit includes a third transistor, an eleventh transistor, and a first capacitor. A control electrode of the third transistor is connected to the first node, a first electrode of the third transistor is connected to a clock terminal for receiving the clock signal, a second electrode of the third transistor is connected to the first output terminal, a control electrode of the eleventh transistor is connected to the first node, a first electrode of the eleventh transistor is connected to the clock terminal for receiving the clock signal, a second electrode of the eleventh transistor is connected to the third output terminal, a first terminal of the first capacitor is connected to the first node, and a second terminal of the first capacitor is connected to the first output terminal. The second output circuit includes a seventh transistor, an eighth transistor, a ninth transistor and a tenth transistor. A control electrode of the seventh transistor and a first electrode of the seventh transistor are respectively connected to the second voltage terminal, a control electrode of the eighth transistor is connected to a second electrode of the seventh transistor, a first electrode of the eighth transistor is connected to the second voltage terminal, a second electrode of the eighth transistor is connected to the second node, a control electrode of the ninth transistor is connected to the first node, a first electrode of the ninth transistor is connected to the second electrode of the seventh transistor, a second electrode of the ninth transistor is connected to the first voltage terminal, a control electrode of the tenth transistor is connected to the first node, a first electrode of the tenth transistor is connected to the second node, and a second electrode of the tenth transistor is connected to the first voltage terminal. The control circuit includes a fifth transistor, a sixth transistor, and a twelfth transistor. A control electrode of the fifth transistor is connected to the second node, a first electrode of the fifth transistor is connected to the first node, a second electrode of the fifth transistor is connected to the first voltage terminal, a control electrode of the sixth transistor is connected to the second node, a first electrode of the sixth transistor is connected to the first output terminal, a second electrode of the sixth transistor is connected to the first voltage terminal, a control electrode of the twelfth transistor is connected to the second node, a first electrode of the twelfth transistor is connected to the third output terminal, and a second electrode of the twelfth transistor is connected to the first voltage terminal. The reset circuit includes a second transistor and a fourth transistor. A control electrode of the second transistor is connected to a reset terminal for receiving the reset signal, a first electrode of the second transistor is connected to the first node, a second electrode of the second transistor is connected to the first voltage terminal, a control electrode of the fourth transistor is connected to the reset terminal for receiving the reset signal, a first electrode of the fourth transistor is connected to the first output terminal, and a second electrode of the fourth transistor is connected to the first voltage terminal.

At least one embodiment of the present disclosure further provides a gate driving circuit which includes N cascaded shift registers provided by embodiments of the present disclosure. The N is an integer greater than or equal to 3, a third output terminal of a $m^{th}$ shift register of the N shift registers is connected to a $(m+2)^{th}$ shift register of the N shift registers for providing the input signal, and m is an integer and $1 \leq m \leq N-2$. And a $n^{th}$ shift register of the N shift registers is connected to a third output terminal of a $(n+2)^{th}$ shift register of the N shift registers for receiving a reset signal, and n is an integer and $1 \leq n \leq N-2$.

At least one embodiment of the present disclosure further provides a display device, which includes the gate driving circuit provided by embodiments of the present disclosure.

For example, the display device provided by an embodiment of the present disclosure further includes a plurality of row scanning signal lines and a plurality of control signal lines. A first output terminal of each shift register in the gate driving circuit is connected to one of the plurality of row scanning signal lines, and a second output terminal of each shift register in the gate driving circuit is connected to one of the plurality of control signal lines.

For example, the display device provided by an embodiment of the present disclosure further includes a plurality of pixel units arranged in an array, and the array includes a plurality of rows and a plurality of columns.

For example, in the display device provided by an embodiment of the present disclosure, each of the pixel units includes a pixel circuit including a first switching transistor, a second switching transistor, a third switching transistor, a fourth switching transistor, a second capacitor, and a light emitting element. A control electrode of the first switching transistor is connected to one of the plurality of row scanning signal lines, a first electrode of the first switching transistor is connected to a control electrode of the second switching transistor, and a second electrode of the first switching transistor is connected to a third node. A first electrode of the second switching transistor is connected to a first voltage source, and a second electrode of the second switching transistor is connected to a fourth node. A control electrode of the third switching transistor is connected to the control electrode of the first switching transistor, a first electrode of the third switching transistor is connected to the third node, and a second electrode of the third switching transistor is connected to a data signal line. A control electrode of the fourth switching transistor is connected to one of the plurality of control signal lines, a first electrode of the fourth switching transistor is connected to the light emitting element, and a second electrode of the fourth switching transistor is connected to a second voltage source. A first terminal of the second capacitor is connected to the control electrode of the second switching transistor, and a second terminal of the second capacitor is connected to the first electrode of the second switching transistor. And a first electrode of the light emitting element is connected to the first electrode of the fourth switching transistor, and a second electrode of the light emitting element is connected to the fourth node.

For example, in the display device provided by an embodiment of the present disclosure, the light emitting element includes an organic light emitting diode.

For example, in the display device provided by an embodiment of the present disclosure, the display device includes an active matrix organic light emitting diode display device.

At least one embodiment of the present disclosure further provides a method of driving the shift register provided by embodiments of the present disclosure, which includes: in a first stage, when the input signal is at a second level, making the input circuit transmit the input signal to the first node, and when the level of the first node is the second level, making the first output circuit transmit a first level of the received clock signal to the first output terminal and the third output terminal, and making the second output circuit transmit the first level of the first voltage terminal to the second node and the second output terminal; in a second stage, when the level of the first node is the second level, making the first output circuit transmit a second level of the received clock signal to the first output terminal and the third output terminal; and in a third stage, when the level of the first node is a first level, making the second output circuit transmit the second level of the second voltage terminal to the second node and the second output terminal.

At least one embodiment of the present disclosure further provides a method of driving the shift register provided by embodiments of the present disclosure, which includes: in a first stage, when the input signal is at a second level, making the input circuit transmit the input signal to the first node, and when the level of the first node is the second level, making the first output circuit transmit a first level of the received clock signal to the first output terminal and the third output terminal, and making the second output circuit transmit the first level of the first voltage terminal to the second node and the second output terminal; in a second stage, when the level of the first node is the second level, making the first output circuit transmit a second level of the received clock signal to the first output terminal and the third output terminal; and in a third stage, when the reset signal is at the second level, making the reset circuit transmit the first level of the first voltage terminal to the first output terminal and the first node, when the level of the first node is a first level, making the second output circuit transmit the second level of the second voltage terminal to the second node and the second output terminal, and when the level of the second node is the second level, making the control circuit transmit the first level of the first voltage terminal to the first node, the first output terminal, and the third output terminal.

DETAILED DESCRIPTION

Figure 1:
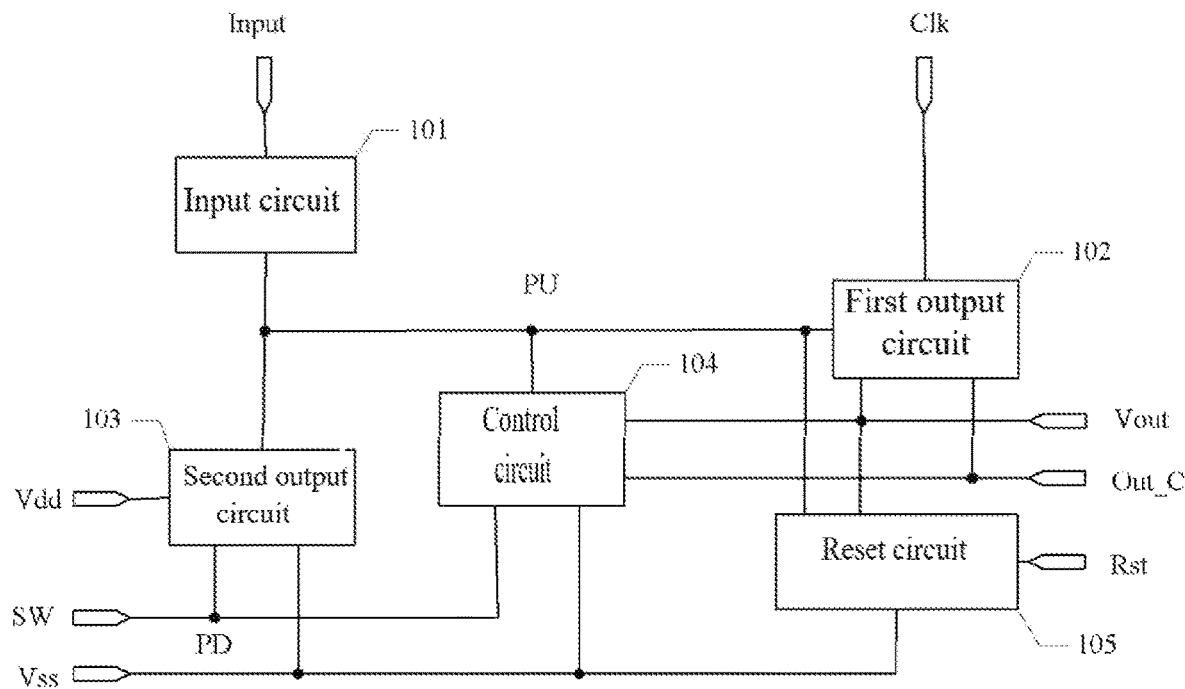
FIG. 1 illustrates a schematic diagram of a shift register provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by those of ordinary skill in the art to which the present disclosure belongs. The terms "first," "second," etc., which are used in the description and the claims of the present disclosure, are not intended to indicate any sequence, amount or importance, but used to distinguish various components. Similarly, the terms, such as "a", "an" or "the" or the like, are not intended to limit the quantity, but used to indicate the presence of at least one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/ coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Further, in the description of the embodiments of the present disclosure, the terms "first level" and "second level" are only used to distinguish an amplitude difference between the two levels. For example, the following description will take the "first level" as a low level and take the "second level" as a high level. Those skilled in the art will understand that the embodiments of the present disclosure are not limited thereto.

Transistors adopted in the embodiments of the present disclosure may be thin film transistors or field effect transistors or other devices with same characteristics. In some embodiments, a transistor may be an oxide semiconductor transistor. Because a source electrode and a drain electrode of a transistor used here are symmetrical, the source electrode and the drain electrode may be interchanged. In the embodiments of the present disclosure, one of the source electrode and the drain electrode is referred to as a first electrode, the other of the source electrode and the drain electrode is referred to as a second electrode, and a gate electrode of a transistor is referred to as a control electrode. In the following embodiments, transistors being N-type transistors are taken as an example for description. Those skilled in the art will understand that some or all of the transistors of the embodiments of the present disclosure may also adopt P-type transistors.

With regard to a pixel circuit with current compensation for driving an AMOLED (Active Matrix Organic Light Emitting Diode), a gate driving circuit usually provides a driving signal, while the other driving signal required by the pixel circuit needs to be provided by an independent signal line other than the gate driving circuit. The independent signal line occupies, for example, a wiring space of a display device, which is adverse to the implement of a narrow bezel of a display device.

A shift register and a method of driving a shift register, a gate driving circuit, a pixel circuit and a display device provided by at least one embodiment of the present disclosure can provide two kinds of driving signals for the pixel circuit through the gate driving circuit, so that there is no need to arrange an independent signal line outside the gate driving circuit, thereby facilitating the display device which includes the gate driving circuit to implement a narrow bezel.

FIG. 1 illustrates a schematic diagram of a shift register 100 provided by at least one embodiment of the present disclosure.

As illustrated in FIG. 1, the shift register 100 includes an input circuit 101. For example, the input circuit 101 is connected to a first node PU and is configured to control a level of the first node PU in response to an input signal. For example, the input circuit 101 may be connected to an input terminal INPUT for receiving the input signal and transmit the input signal to the first node PU in response to the input signal, thereby controlling the level of the first node PU, for example, charging the first node PU to pull up the level of the first node PU. It should be noted that the embodiments of the present disclosure are not limited to this. For example, the input circuit 101 may be connected to a voltage signal terminal for receiving a fixed voltage signal, so that the fixed voltage signal can be transmitted to the first node PU in response to the input signal, thereby controlling the level of the first node PU.

For example, as illustrated in FIG. 1, the shift register 100 further includes a first output circuit 102. For example, the first output circuit 102 is connected to the first node PU, a first output terminal Vout, and a third output terminal Out_C, and is configured to transmit a received clock signal to the first output terminal Vout and the third output terminal Out_C in response to the level of the first node PU. For example, the first output circuit 102 may be connected to a clock terminal Clk for receiving the clock signal, for example, the clock signal may include a first level and a second level, i.e., the clock signal may vary between a high level and a low level. For example, in a case where the level of the first node PU is a second level, that is, the high level, the first output circuit 102 is turned on in response to the high level, so that the received clock signal can be transmitted to the first output terminal Vout and the third output terminal Out_C.

For example, as illustrated in FIG. 1, the shift register 100 further includes a reset circuit 105. For example, the reset circuit 105 is connected to a first voltage terminal Vss, the first node PU, and the first output terminal Vout, and is configured to transmit a first level of the first voltage terminal Vss to the first output terminal Vout and the first node PU in response to a reset signal. For example, the reset circuit 105 may be connected to a reset terminal Rst for receiving the reset signal. For example, a level of the first voltage terminal Vss may be constant, e.g., the first level, i.e., a low level.

For example, as illustrated in FIG. 1, the shift register 100 further includes a second output circuit 103. For example, the second output circuit 103 is connected to the first node PU, the first voltage terminal Vss, a second voltage terminal Vdd, and a second node PD, and is configured to transmit the first level of the first voltage terminal Vss to the second node PD and a second output terminal SW in response to the level of the first node PU (e.g., the second level, i.e., a high level), and to transmit a second level of the second voltage terminal Vdd to the second node PD and the second output terminal SW in response to the level of the first node PU (e.g., the first level, i.e., a low level). The second node PD may be connected to the second output SW. A level of the second voltage terminal Vdd may be constant, for example, a second level.

For example, as illustrated in FIG. 1, the shift register 100 further includes a control circuit 104. For example, the control circuit 104 is connected to the first node PU, the second node PD, the first voltage terminal Vss, the first output terminal Vout, and the third output terminal Out_C, and is configured to transmit the first level of the first voltage terminal Vss to the first node PU, the first output terminal Vout, and the third output terminal Out_C in response to a level of the second node PD (e.g., the second level, i.e., a high level).

Figure 2:
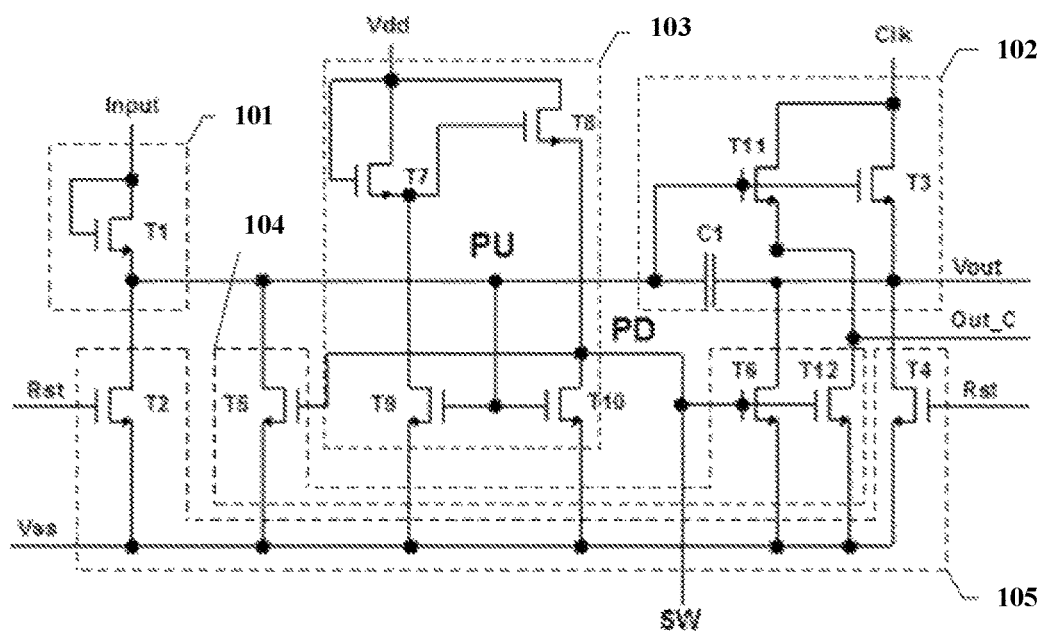
FIG. 2 illustrates a circuit diagram of a shift register provided by at least one embodiment of the present disclosure.

FIG. 2 illustrates a circuit diagram of an implementation example of a shift register 100 provided by at least one embodiment of the present disclosure.

For example, as illustrated in FIG. 2, the input circuit 101 may be implemented as a first transistor T1. A control electrode of the first transistor T1 and a first electrode of the first transistor T1 are respectively connected to an input terminal INPUT for receiving the input signal, and a second electrode of the first transistor T1 is connected to a first node PU. It should be noted that the embodiments of the present disclosure include but are not limited to this, for example, the first electrode of the first transistor T1 may be connected to a voltage signal terminal for receiving a fixed voltage signal, so that in a case where the first transistor T1 is turned on in response to the input signal, the fixed voltage signal may be transmitted to the first node PU, thereby controlling a level of the first node PU, for example, the first node PU may be charged to pull up the level of the first node PU.

For example, as illustrated in FIG. 2, the first output circuit 102 may be implemented to include a third transistor T3, an eleventh transistor T11, and a first capacitor C1. A control electrode of the third transistor T3 is connected to the first node PU, a first electrode of the third transistor T3 is connected to a clock terminal Clk for receiving the clock signal, and a second electrode of the third transistor T3 is connected to a first output terminal Vout. A control electrode of the eleventh transistor T11 is connected to the first node PU, a first electrode of the eleventh transistor T11 is connected to the clock terminal Clk for receiving the clock signal, and a second electrode of the eleventh transistor T11 is connected to a third output terminal Out_C. A first terminal of the first capacitor C1 is connected to the first node PU, and a second terminal of the first capacitor C1 is connected to the first output terminal Vout.

It should be noted that the shift register 100 provided by the embodiments of the present disclosure is not limited to the case illustrated in FIG. 2. For example, the first output circuit 102 may also include only one transistor, for example, only the third transistor T3 or only the eleventh transistor T11. In this case, the first output circuit 102 only needs to be provided with one output terminal, for example, only the first output terminal Vout or the third output terminal Out_C, i.e., a signal output from the output terminal is provided to pixel units as a driving signal, and is also provided to other stages of shift registers as an input signal or a reset signal.

For example, as illustrated in FIG. 2, the second output circuit 103 may be implemented to include a seventh transistor T7, an eighth transistor T8, a ninth transistor T9, and a tenth transistor T10. A control electrode of the seventh transistor T7 and a first electrode of the seventh transistor T7 are both connected to a second voltage terminal Vdd, and a second electrode of the seventh transistor T7 is connected to a first electrode of the ninth transistor T9. A control electrode of the eighth transistor T8 is connected to the second electrode of the seventh transistor T7, a first electrode of the eighth transistor T8 is connected to the second voltage terminal Vdd, and a second electrode of the eighth transistor T8 is connected to a second node PD. The second node PD is connected to a second output terminal SW. A control electrode of the ninth transistor T9 is connected to the first node PU, a first electrode of the ninth transistor T9 is connected to the second electrode of the seventh transistor, and a second electrode of the ninth transistor T9 is connected to the first voltage terminal Vss. A control electrode of the tenth transistor T10 is connected to the first node PU, a first electrode of the tenth transistor T10 is connected to the second node PD, and a second electrode of the tenth transistor T10 is connected to the first voltage terminal Vss.

For example, as illustrated in FIG. 2, the control circuit 104 may be implemented to include a fifth transistor T5, a sixth transistor T6, and a twelfth transistor T12. A control electrode of the fifth transistor T5 is connected to the second node PD, a first electrode of the fifth transistor T5 is connected to the first node PU, and a second electrode of the fifth transistor T5 is connected to the first voltage terminal Vss. A control electrode of the sixth transistor T6 is connected to the second node PD, a first electrode of the sixth transistor T6 is connected to the first output terminal Vout, and a second electrode of the sixth transistor T6 is connected to the first voltage terminal Vss. A control electrode of the twelfth transistor T12 is connected to the second node PD, a first electrode of the twelfth transistor T12 is connected to the third output terminal Out_C, and a second electrode of the twelfth transistor T12 is connected to the first voltage terminal Vss.

For example, as illustrated in FIG. 2, the reset circuit 105 may be implemented to include a second transistor T2 and a fourth transistor T4. A control electrode of the second transistor T2 is connected to a reset terminal Rst for receiving the reset signal, a first electrode of the second transistor T2 is connected to the first node PU, and a second electrode of the second transistor T2 is connected to the first voltage terminal Vss. A control electrode of the fourth transistor T4 is connected to the reset terminal Rst for receiving the reset signal, a first electrode of the fourth transistor T4 is connected to the first output terminal Vout, and a second electrode of the fourth transistor T4 is connected to the first voltage terminal Vss.

The shift register provided by at least one embodiment of the present disclosure can provide two kinds of driving signals for a pixel circuit, so that there is no need to provide an independent signal line, thereby facilitating the display device which includes the shift register to implement a narrow bezel.

At least one embodiment of the present disclosure further provides a method of driving a shift register, which may be applied to the shift register provided by the embodiments of the present disclosure. It should be noted that a serial number of respective step in the following driving method is only for easier description of the step, and should not be regarded as an execution order of each step. Unless explicitly indicated, the driving method need not to be performed completely in the order illustrated.

Figure 3:
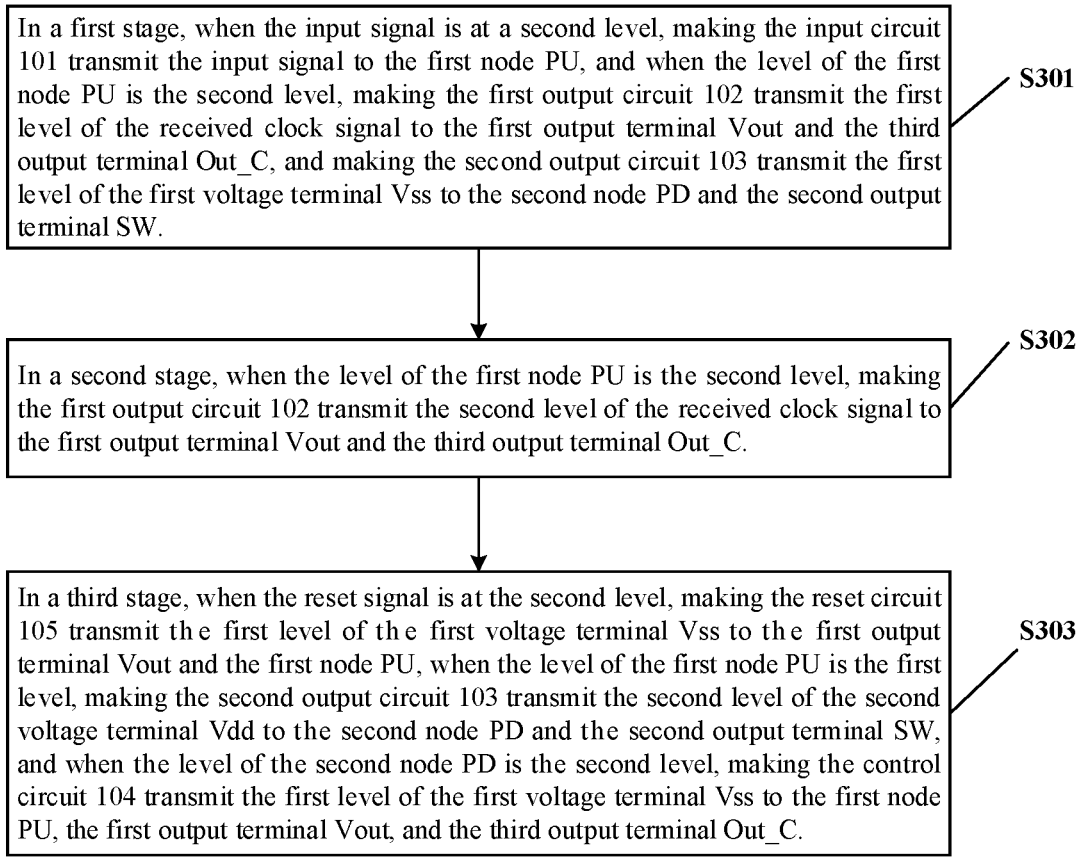
FIG. 3 illustrates a flowchart of a method of driving a shift register provided by at least one embodiment of the present disclosure.

FIG. 3 illustrates a flowchart of a method 300 of driving a shift register provided by at least one embodiment of the present disclosure. For example, as illustrated in FIG. 3, the driving method 300 may include the following operation steps.

Step S301: in a first stage, when the input signal is at a second level, making the input circuit 101 transmit the input signal to the first node PU, and when the level of the first node PU is the second level, making the first output circuit 102 transmit the first level of the received clock signal to the first output terminal Vout and the third output terminal Out_C, and making the second output circuit 103 transmit the first level of the first voltage terminal Vss to the second node PD and the second output terminal SW.

Step S302: in a second stage, when the level of the first node PU is the second level, making the first output circuit 102 transmit the second level of the received clock signal to the first output terminal Vout and the third output terminal Out_C. In this second stage, the level of the first node PU is maintained the second level, and the second output circuit 103 maintains transmitting the first level of the first voltage terminal Vss to the second node PD and the second output terminal SW.

Step S303: in a third stage, when the reset signal is at the second level, making the reset circuit 105 transmit the first level of the first voltage terminal Vss to the first output terminal Vout and the first node PU, when the level of the first node PU is the first level, making the second output circuit 103 transmit the second level of the second voltage terminal Vdd to the second node PD and the second output terminal SW, and when the level of the second node PD is the second level, making the control circuit 104 transmit the first level of the first voltage terminal Vss to the first node PU, the first output terminal Vout, and the third output terminal Out_C.

The operation principle of the shift register provided by at least one embodiment of the present disclosure will be described in detail below with reference to FIGS. 2, 3 and 4. It should be noted that in the following embodiments, the transistors being N-type transistors, the first level being a low level, and the second level being a high level are taken as an example for description.

Figure 4:
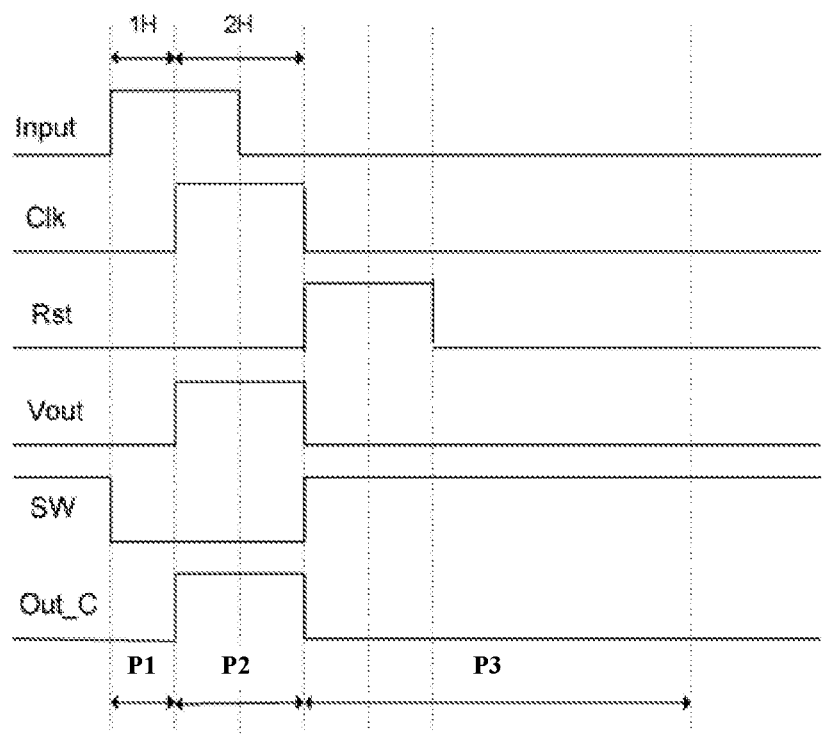
FIG. 4 illustrates an operation timing diagram for the shift register illustrated in FIG. 2 provided by at least one embodiment of the present disclosure.

FIG. 4 illustrates an operation timing diagram for a shift register provided by at least one embodiment of the present disclosure.

For example, as illustrated in FIG. 4, in a P1 period (for example, a duration of the P1 period is a minimum time interval 1H of effectively turning on when line scanning), the input signal Input is at a high level, the first transistor T1 is turned on, and the level of the first node PU starts to be pulled up to a high level. Because the level of the first node PU is a high level, both the ninth transistor T9 and the tenth transistor T10 are turned on, and the low level of the first voltage terminal Vss is transmitted to the second node PD through the tenth transistor T10 which is turned on, and then transmitted to the second output terminal SW. In addition, because the level of the first node PU is the high level, both the eleventh transistor T11 and the thirteenth transistor T13 are turned on, the clock signal received from the clock terminal Clk is transmitted to the first output terminal Vout and the third output terminal Out_C, respectively. Because the clock signal is at a low level at this time, the first output terminal Vout and the third output terminal Out_C are also at a low level. In this P1 period, the first output terminal Vout is at the low level, the second output terminal SW is at the low level, and the third output terminal Out_C is also at the low level.

For example, as illustrated in FIG. 4, in a P2 period (for example, a duration of the P2 period is 2H), the level of the first node PU is maintained the high level, and the clock signal of the clock terminal Clk becomes at the high level. Because the level of the first node PU is the high level, the eleventh transistor T11 and the thirteenth transistor T13 are maintained in a state of turn-on, and the clock signal received from the clock terminal Clk is transmitted to the first output terminal Vout and the third output terminal Out_C, respectively. Because the clock signal is at the high level at this time, the first output terminal Vout and the third output terminal Out_C are also at the high level. In addition, because the level of the first node PU is still the high level, both the ninth transistor T9 and the tenth transistor T10 are maintained in the state of turn-on, and the low level of the first voltage terminal Vss is transmitted to the second node PD through the tenth transistor T10 which is turned on, and then transmitted to the second output terminal SW. In this P2 period, the first output terminal Vout is at the high level, the second output terminal SW is at the low level, and the third output terminal Out_C is also at the high level.

For example, as illustrated in FIG. 4, in a P3 period, the reset signal received through the reset terminal Rst becomes at the high level, so both a second transistor T2 and a fourth transistor T4 are turned on, and the low level of the first voltage terminal Vss is transmitted to the first node PU through the second transistor T2 which is turned on, thereby resetting the first node PU to be at the low level. Meanwhile, the low level of the first voltage terminal Vss is transmitted to the first output terminal Vout through the fourth transistor T4 which is turned on, thereby resetting the first output terminal Vout to be at the low level. In addition, because a level of a second voltage terminal Vdd is the high level, a seventh transistor T7 is maintained in a state of turn-on, and further the eighth transistor T8 is turned on, so that the high level of the second voltage terminal Vdd is transmitted to the second node PD and then to the second output terminal SW. In addition, because the level of the second node PD is the high level, both the sixth transistor T6 and the twelfth transistor T12 are turned on, so that the low level of the first voltage terminal Vss is transmitted to the first output terminal Vout and the third output terminal Out_C. In this P3 period, the first output terminal Vout is at the low level, the second output terminal SW is at the high level, and the third output terminal Out_C is also at the low level.

It should be noted that in the embodiments of the present disclosure, the P1 period, the P2 period and the P3 period are selected according to the actual time required for signal switching, with no mutual interference during the signal switching as a standard. In practice, the P3 period (i.e., a light emitting stage for an OLED) is longer than the P1 period and longer than the P2 period. In addition, although 1H is used as a time reference in FIG. 4, those skilled in the art may understand that the P1 period, the P2 period and the P3 period may also use other times as a time reference, and the embodiments of the present disclosure are not limited to this.

The method for driving a shift register provided by at least one embodiment of the present disclosure can enable the shift register to provide two kinds of driving signals, for example, the two kinds of driving signals may be used to drive AMOLED pixel circuits, so that there is no need for an additional independent signal line to provide a driving signal, thereby facilitating a display device to implement a narrow bezel.

At least one embodiment of the present disclosure further provides a gate driving circuit, which includes N cascaded shift registers according to the embodiments of the present disclosure, and N may be an integer greater than or equal to 3. For example, the shift register 100 may adopt the shift register 100 illustrated in FIG. 1 or 2. In the gate driving circuit provided by the embodiments of the present disclosure, a third output terminal Out_C of a $m^{th}$ shift register of the N shift registers is connected to an input terminal Input of a $(m+2)^{th}$ shift register of the N shift registers for providing the input signal, and the m is an integer and $1 \leqslant m \leqslant N-2$. And a reset terminal Rst of a $n^{th}$ shift register of the N shift registers is connected to a third output terminal Out_C of a $(n+2)^{th}$ shift register of the N shift registers for receiving the reset signal, and n is an integer and $1 \leqslant n \leqslant N-2$.

Figure 5:
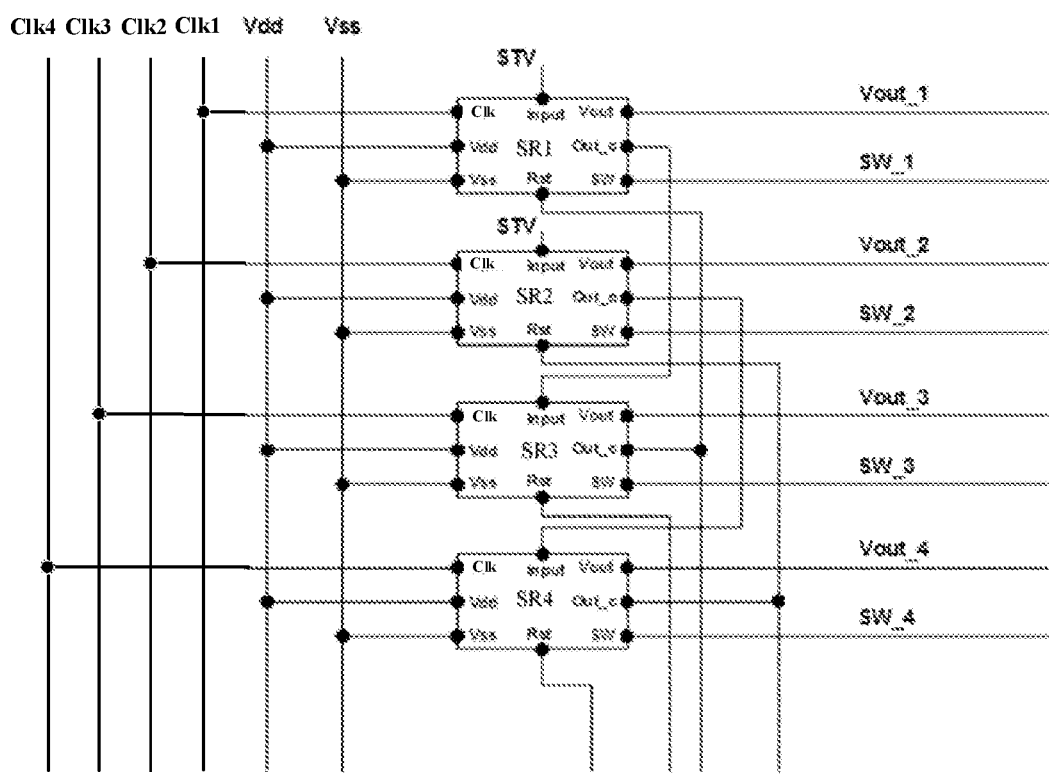
FIG. 5 illustrates a schematic diagram of a gate driving circuit provided by at least one embodiment of the present disclosure.

For example, FIG. 5 illustrates a schematic diagram of a gate driving circuit provided by at least one embodiment of the present disclosure. For convenience of explanation, FIG. 5 illustrates only first four-stage shift registers of the gate driving circuit (i.e., a first-stage shift register SR1 to a fourth-stage shift register SR4). However, those skilled in the art can obtain a cascade mode of shift registers of other stages in the gate driving circuit according to the schematic diagram illustrated in FIG. 5.

For example, as illustrated in FIG. 5, input signals received by input terminals Input of the first-stage shift register SR1 and the second-stage shift register SR2 each is a start frame signal STV. Starting from the third-stage shift register SR3, an input terminal Input of a shift register of a certain stage is connected to a third output terminal Out_C of a previous two-stage shift register. For example, an input signal received by an input terminal Input of the third stage shift register SR3 comes from a third output terminal Out_C of the first-stage shift register SR1, and an input signal received by an input terminal Input of the fourth-stage shift register SR4 comes from a third output terminal Out_C of the second-stage shift register SR2.

In addition, as illustrated in FIG. 5, starting from the first-stage shift register SR1, a reset terminal Rst of a shift register of a certain stage is connected to a third output terminal Out_C of a next two-stage shift register. For example, a signal received by a reset terminal Rst of the first-stage shift register SR1 comes from a third output terminal Out_C of the third-stage shift register SR3. A signal received by a reset terminal Rst of the second-stage shift register SR2 comes from a third output terminal Out_C of the fourth-stage SR4 shift register. For example, signals received by reset terminals Rst of last two-stage shift registers in the gate driving circuit may be set according to actual needs, and the embodiments of the present disclosure are not limited to this.

For example, as illustrated in FIG. 5, second voltage terminals of the first-stage shift register SR1 to the fourth-stage shift register SR4 are all connected to a signal line Vdd, and first voltage terminals of the first-stage shift register SR1 to the fourth-stage shift register SR4 are all connected to a signal line Vss. A first output terminal Vout of the first-stage shift register SR1 is connected to a signal line Vout_1, a first output terminal Vout of the second-stage shift register SR2 is connected to a signal line Vout_2, a first output terminal Vout of the third-stage shift register SR3 is connected to a signal line Vout_3, and a first output terminal Vout of the fourth-stage shift register SR4 is connected to a signal line Vout_4. A second output terminal SW of the first-stage shift register SR1 is connected to a signal line SW_1, a second output terminal SW of the second-stage shift register SR2 is connected to a signal line SW_2, a second output SW of the third-stage shift register SR3 is connected to a signal line SW_3, and a second output SW of the fourth-stage shift register SR4 is connected to a signal line SW_4.

For example, as illustrated in FIG. 5, the gate driving circuit adopts four clock signal lines (Clk1, Clk2, Clk3 and Clk4) for providing clock signals. For example, the clock signal line Clk1 is connected to a clock terminal Clk of the first-stage shift register SR1, the clock signal line Clk2 is connected to a clock terminal Clk of the second-stage shift register SR2, the clock signal line Clk3 is connected to a clock terminal Clk of the third-stage shift register SR3, and the clock signal line Clk4 is connected to a clock terminal Clk of the fourth-stage shift register SR4. It should be noted that the embodiments of the present disclosure include but are not limited to the situation illustrated in FIG. 5, and the amount of clock signal lines is not limited to 4, and may be set according to actual needs.

Figure 6:
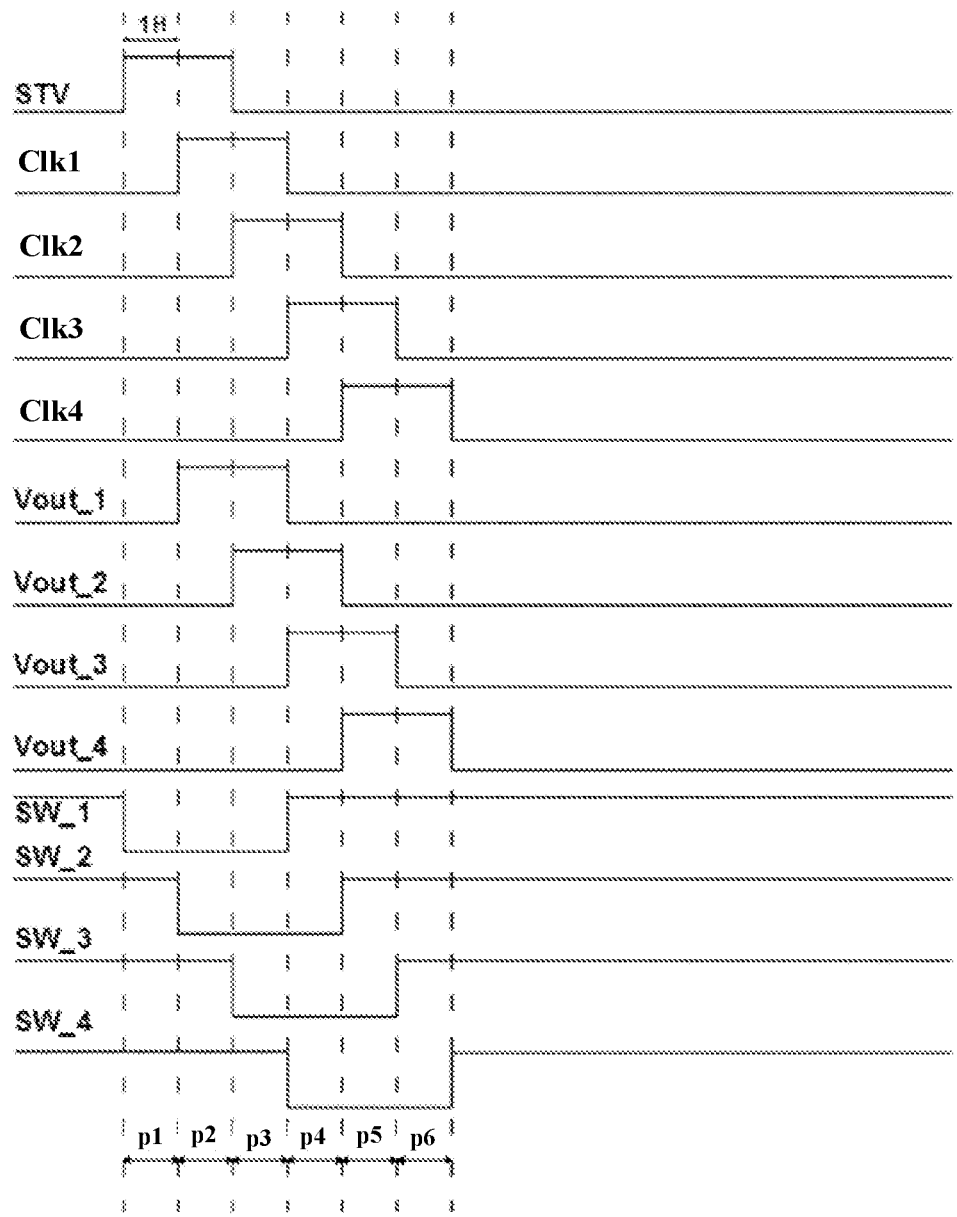
FIG. 6 illustrates a signal timing diagram of the gate driving circuit illustrated in FIG. 5.

FIG. 6 illustrates a signal timing diagram for the gate driving circuit illustrated in FIG. 5.

For example, as illustrated in FIG. 6, with regard to the first-stage shift register SR1, during the p1 period, as described above, because the input signal STV received by the input terminal INPUT of the first-stage shift register SR1 is at a high level and a clock signal Clk1 received by the clock terminal Clk is at a low level, an output signal Vout_1 of the first output terminal Vout of the first-stage shift register SR1 is at a low level and an output signal SW_1 of the second output terminal SW of the first-stage shift register SR1 is at the low level. In the p2 period and the p3 period, as described above, because the clock signal Clk1 received by the clock terminal Clk of the first-stage shift register SR1 becomes at the high level, the output signal Vout_1 of the first output terminal Vout of the first-stage shift register SR1 is at the high level, and the output signal SW_1 of the second output terminal SW of the first-stage shift register SR1 is at the low level. From a p4 period to a p6 period, as described below, because a clock signal Clk3 received by the clock terminal Clk of the third-stage shift register SR3 becomes at the high level, an output signal Vout_1 of the first output terminal Vout of the third-stage shift register SR3 and an output signal of the third output terminal Out_C (not illustrated in FIG. 6) of the third-stage shift register SR3 both become at the high level. Because the output signal of the third output terminal Out_C of the third-stage shift register SR3 serves as the reset signal of the first stage shift register SR1, the reset signal received by the reset terminal Rst of the first-stage shift register SR1 is at the high level at this time. As described above, this can cause the output signal Vout_1 of the first output terminal Vout of the first-stage shift register SR1 to be at the low level and cause the output signal SW_1 of the second output terminal SW of the first-stage shift register SR1 to be at the high level. Thereafter, if the input signal received by the input terminal INPUT of the first-stage shift register SR1 is again at the high level, the foregoing process is repeated.

With regard to the second-stage shift register SR2, unlike the first-stage shift register SR1, the input signal STV (not illustrated) received by the input terminal Input of the second-stage shift register SR2 is at the high level and the clock signal Clk2 received by the clock terminal CLK of the second-stage shift register SR2 is at the low level during the p2 period. Therefore, various changes of the second-stage shift register SR2 are delayed by 1H compared with the first-stage shift register SR1. That is, in the p2 period, the output signal Vout_2 of the first output terminal Vout of the second-stage shift register SR2 is at the low level, and the output signal SW_2 of the second output terminal SW of the second-stage shift register SR2 is at the low level. In the p3 period and the p4 period, the output signal Vout_2 of the first output terminal Vout of the second-stage shift register SR2 is at the high level, and the output signal SW_2 of the second output terminal SW of the second-stage shift register SR2 is at the low level. Starting from the p5 period, the output signal Vout_2 of the first output terminal Vout of the second-stage shift register SR2 is at the low level, and the output signal SW_2 of the second output terminal SW of the second-stage shift register SR2 is at the high level.

With regard to the third-stage shift register SR3, the input signal received by the input terminal Input serves as the output signal of the third output terminal Out_C of the first-stage shift register SR1, instead of the STV signal. In the p3 period, the output signal Vout_1 of the first output terminal Vout of the first-stage shift register SR1 corresponding to the third output terminal Out_C of the first-stage shift register SR1 is at the high level, and the clock signal Clk3 received by the clock terminal Clk of the third-stage shift register SR3 is at the low level, so the output signal Vout_3 of the first output terminal Vout of the third-stage shift register SR3 is at the low level, and the output signal SW_3 of the second output terminal SW of the third-stage shift register SR3 is at the low level. In the p4 period and the p5 period, as described above, because the clock signal Clk3 received by the clock terminal CLK of the third-stage shift register SR3 becomes at the high level, the output signal Vout_3 of the first output terminal Vout of the third-stage shift register SR3 is at the high level, and the output signal SW_3 of the second output terminal SW of the third-shift register SR3 is at the low level. Similar to the first-stage shift register SR1, starting from the p6 period, the reset signal received by the reset terminal Rst of the third-stage shift register SR3 becomes at the high level. Therefore, the output signal Vout_3 of the first output terminal Vout of the third-stage shift register SR3 becomes the low level, and the output signal SW_3 of the second output terminal SW of the third-stage shift register becomes at the high level. Level changes of the shift registers of other stages are similar to this.

The gate driving circuit provided by at least one embodiment of the present disclosure can provide two kinds of driving signals for a pixel circuit, so that there is no need to provide an independent signal line outside the gate driving circuit, thereby facilitating the display device which includes the gate driving circuit to implement a narrow bezel.

Figure 7:
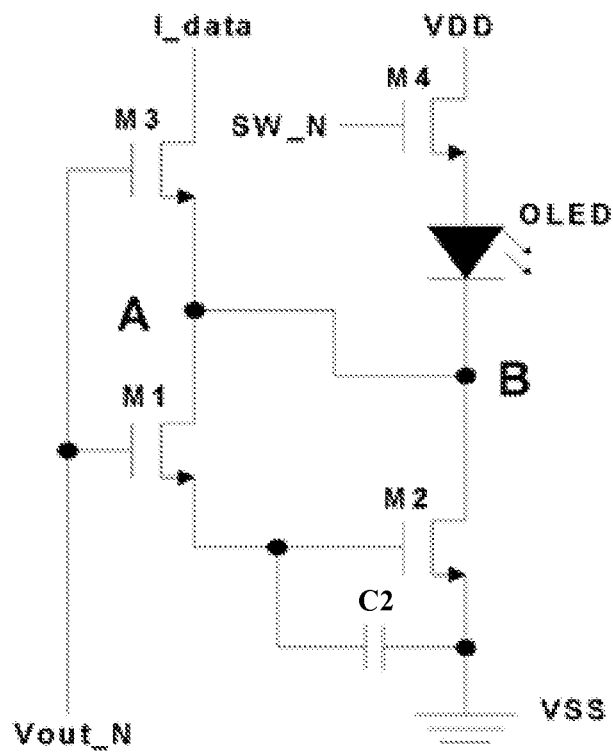
FIG. 7 illustrates a circuit diagram of a pixel circuit provided by at least one embodiment of the present disclosure.

FIG. 7 illustrates a circuit diagram of a pixel circuit provided by at least one embodiment of the present disclosure. For example, the pixel circuit may be used to drive an AMOLED to emit light. For example, the pixel circuit may be driven by a driving signal generated by the shift register provided by the embodiments of the present disclosure. It should be noted that the following embodiments are all illustrated by taking N-type transistors as an example, at this time, a control electrode of the transistor is a gate electrode, a source electrode of the transistor is a first electrode, and a drain electrode of the transistor is a second electrode. The embodiments of the present disclosure include but are not limited to this, for example, one or all of the transistors may also be P-type transistor or P-type transistors.

For example, as illustrated in FIG. 7, the pixel circuit may include 4 transistors and 1 capacitor. Control electrodes (i.e., gate electrodes) of a first switching transistor M1 and a third switching transistor M3 are both connected to a row scanning signal line Vout_N. A second electrode (e.g., a drain electrode) of the third switching transistor M3 is connected to a data signal line I_data, and a first electrode (e.g., a source electrode) of the third switching transistor M3 and a second electrode of the first switching transistor M1 are both connected to a third node A. A first electrode of the first switching transistor M1 is connected to a control electrode of a second switching transistor M2. A second electrode of the second switching transistor M2 is connected to a fourth node B, and a first electrode of the second switching transistor M2 is connected to a first voltage source VSS (for example, the first voltage source VSS is configured to provide a low-level voltage). A first terminal of a second capacitor C is connected to the control electrode of the second switching transistor M2, and a second terminal of the second capacitor C2 is connected to the first electrode of the second switching transistor M2. A second electrode (e.g., a cathode electrode) of a light emitting element OLED is connected to the fourth node B, and a first electrode (e.g., an anode electrode) of the light emitting element OLED is connected to a first electrode of a fourth switching transistor M4. A second electrode of the fourth switching transistor M4 is connected to a second voltage source VDD (for example, the second voltage source VDD is configured to provide a high-level voltage). A control electrode of the fourth switching transistor M4 is connected to a control signal line SW_N. In addition, the third node A and the fourth node B are connected directly, for example, via wires. According to the embodiments of the present disclosure, a signal of the row scanning signal line Vout_N comes from the first output terminal Vout of the $n^{th}$-stage shift register in the gate driving circuit provided by the embodiments of the present disclosure, and a signal of the control signal line SW_N comes from the second output terminal SW of the $n^{th}$-stage shift register in the gate driving circuit provided by the embodiments of the present disclosure, $1 \leq n \leq N$, N is a positive integer and is a total amount of stages (i.e., a total amount) of shift registers in the gate driving circuit.

For example, the light emitting element OLED may be of various types, such as top emission, bottom emission, etc., and may emit red light, green light, blue light, white light, etc., and the embodiments of the present disclosure are not limited thereto.

In the pixel circuit provided by the embodiments of the present disclosure, in addition to the data signal I_data, the other two driving signals required by the pixel circuit may be provided by the gate driving circuit, so that there is no need to arrange an independent signal line outside the gate driving circuit, thereby facilitating the display device which includes the pixel circuit to implement a narrow bezel.

Figure 8:
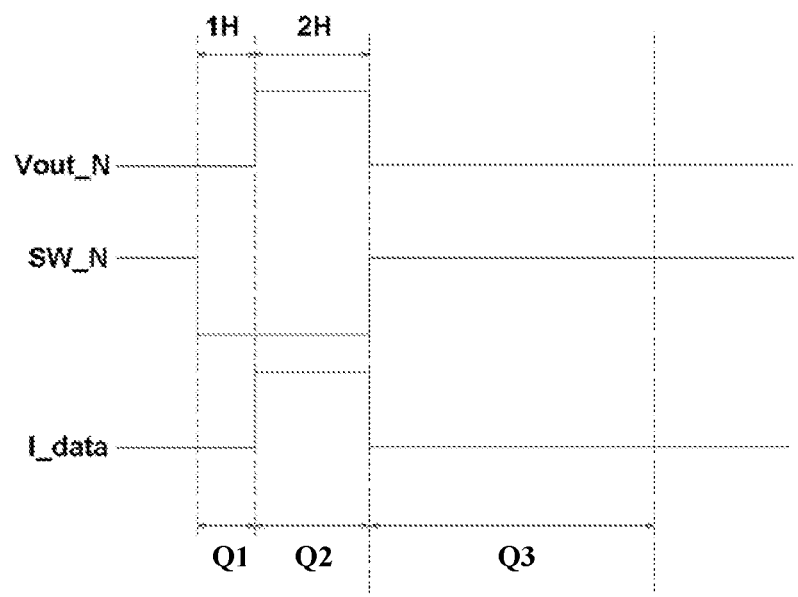
FIG. 8 illustrates a signal timing diagram of the pixel circuit illustrated in FIG. 7.

FIG. 8 illustrates a signal timing diagram for the pixel circuit illustrated in FIG. 7. For example, as illustrated in FIG. 8, the driving of the pixel circuit mainly includes three periods (Q1, Q2, and Q3).

In the Q1 period, as described above, the output signal Vout_N of the first output terminal Vout of the $n^{th}$-stage shift register is at a low level, and the output signal SW_N of the second output terminal SW of the $n^{th}$ stage shift register is at the low level. At this time, the control electrode of the fourth switching transistor M4 where the output signal SW_N of the second output terminal SW of the $n^{th}$ stage shift register serves as an input in the pixel circuit is also at the low level, thus, the fourth switching transistor M4 is turned off, so that the light emitting element OLED connected to the fourth switching transistor M4 is in a state of turn-off. Therefore, the Q1 period may also be referred to as an OLED turn-off period.

In the Q2 period, as described above, the output signal Vout_N of the first output terminal Vout of the $n^{th}$-stage shift register becomes at a high level, and the output signal SW_N of the second output terminal SW of the $n^{th}$-stage shift register is maintained at the low level. In the Q2 period, because the driving signal Vout_N is at the high level, both the first switching transistor M1 and the third switching transistor M3 in the pixel circuit are turned on. Meanwhile, because the driving signal SW_N received by the control electrode of the fourth switching transistor M4 is still at the low level, so the fourth switching transistor M4 is maintained in a state of turn-off. At this time, there is still no driving current passing through the light emitting element OLED, thus, the light emitting element OLED does not work, that is, is in a non-light emitting state.

Meanwhile, because the first switching transistor M1 and the third switching transistor M3 are turned on, a data signal I_data (e.g., a preset current value for driving a light emitting element) is output to the control electrode of the second switching transistor M2 through the turned-on third switching transistor M3 and the turned-on first switching transistor M1, thereby charging the second capacitor C2 and gradually turning on the second switching transistor M2. Meanwhile, the data signal I_data is also transmitted to the second electrode of the second switching transistor M2 through the third node A and the fourth node B, as time goes, the second capacitor C2 is charged to a saturated state. At this time, the data signal I_data all flow through the third node A and the fourth node B, and finally all flow through the second electrode and the first electrode of the second switching transistor M2. At this time, a voltage Vgs (i.e., a voltage difference between the control electrode and the first electrode of the second switching transistor M2) controlling the second switching transistor M2 to be turned on is written in advance to both terminals of the second capacitor C2 through a self-adjustment of the second switching transistor M2, and meanwhile, the current passing through the second switching transistor M2 satisfies the preset current value I_data, which is ready for a correct light emission of the subsequent light emitting element OLED. Therefore, the Q2 period may also be referred to as a writing and compensating period.

In the Q3 period, as described above, the output signal Vout_N of the first output terminal Vout of the $n^{th}$-stage shift register becomes at the low level, and the output signal SW_N of the second output terminal SW of the $n^{th}$-stage shift register becomes at the high level, so both the first switching transistor M1 and the third switching transistor M3 are turned off, and the fourth switching transistor M4 is turned on. Because there is no a discharge loop at both terminals of the second capacitor C2, the voltage difference between the control electrode and the first electrode of the second switching transistor M2 remains unchanged, that is, the second switching transistor M2 is maintained in a state of turn-on. Because the fourth switching transistor M4 is turned on, a current finally flowing through the light emitting element OLED is the preset current value I_data through the self-adjustment of the second switching transistor M2. At this time, the light emitting element OLED is in a light emitting state. For example, the light emitting state of the light emitting element OLED will remain until a high level of the driving signal Vout_N of next frame arrives. Therefore, the Q3 period may also be referred to as an OLED light emitting period.

According to the pixel circuit provided by at least one embodiment of the present disclosure, in addition to the data signal I_data, the other two driving signals for the pixel circuit can be provided through the gate driving circuit, so that there is no need to provide an independent signal line additionally, thereby facilitating the display device which includes the pixel circuit to implement a narrow bezel.

Figure 9:
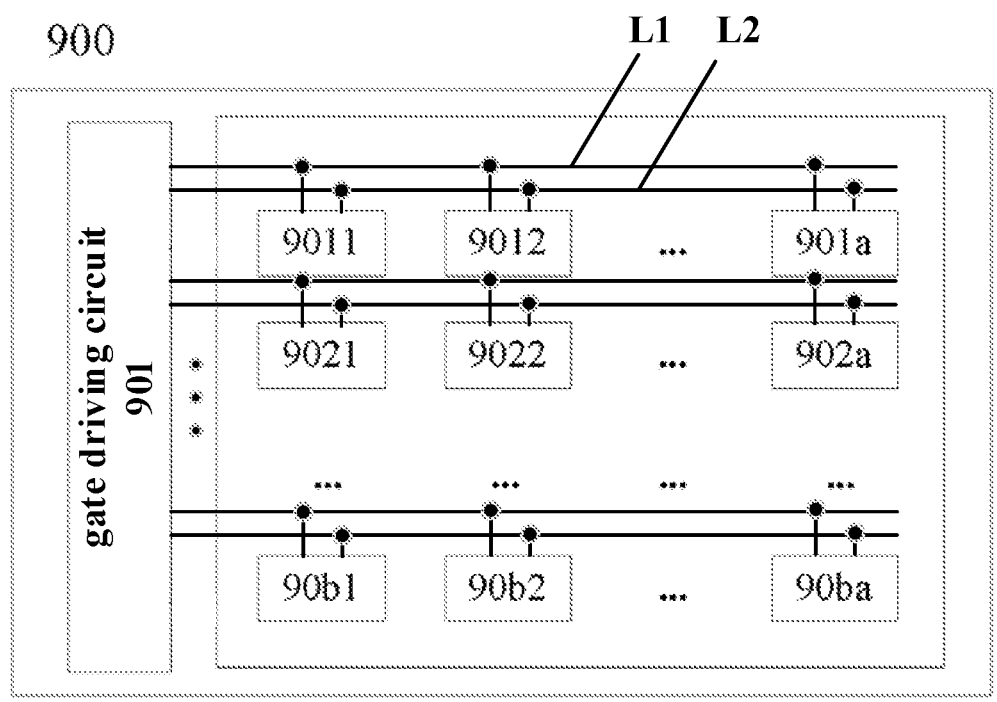
FIG. 9 illustrates a schematic diagram of a display device provided by at least one embodiment of the present disclosure.

At least one embodiment of the present disclosure also provides a display device 900. For example, FIG. 9 illustrates a schematic diagram of the display device 900. The display device 900 provided by at least one embodiment of the present disclosure may be any product or component with display function such as electronic paper, mobile phone, tablet computer, television, display, notebook computer, digital photo frame, navigator, etc. For example, the display device 900 may be an active matrix organic light emitting diode display device.

For example, as illustrated in FIG. 9, the display device 900 includes a gate driving circuit 901, for example, the gate driving circuit 901 may adopt any gate driving circuit provided by the embodiments of the present disclosure.

For example, as illustrated in FIG. 9, the display device 900 further includes a plurality of pixel units arranged in an array which includes a plurality of rows and a plurality of columns, for example, b rows and a columns, where a and b are positive integers. For example, the plurality of pixel units include pixel circuits 9011, 9012, 901a, 9021, 9022, 902a, 90b1, 90b2, . . . , 90ba. Each pixel unit includes a pixel circuit, for example, the pixel circuit may adopt any pixel circuit provided by the embodiments of the present disclosure.

For example, as illustrated in FIG. 9, the display device 900 further includes a plurality of row scanning signal lines L1 and a plurality of control signal lines L2. The first output terminal Vout of each shift register in the gate driving circuit 901 is connected to one of the plurality of row scanning signal lines, and the second output terminal SW of each shift register in the gate driving circuit 901 is connected to one of the plurality of control signal lines L2. Each pixel circuit in each row of pixel units is connected to a corresponding row scanning signal line and a corresponding control signal line.

The display device 900 provided by at least one embodiment of the present disclosure may provide two kinds of driving signals for pixel circuits (e.g., pixel circuits for driving an AMOLED) in pixel units through the gate driving circuit 901, so that there is no need to provide an independent signal line outside the gate driving circuit, thereby facilitating the display device 900 to implement a narrow bezel.

The foregoing merely are specific embodiments of the disclosure, and not intended to define the scope of the disclosure, and the scope of the disclosure is determined by the appended claims.

What is claimed is:

1. A shift register, comprising an input circuit, a first output circuit and a second output circuit,
wherein the input circuit is connected to a first node, and is configured to control a level of the first node in response to an input signal;
the first output circuit is connected to the first node, a first output terminal and a third output terminal, and is configured to transmit a received clock signal to the first output terminal and the third output terminal in response to the level of the first node; and
the second output circuit is connected to the first node, a first voltage terminal, a second voltage terminal and a second node, and is configured to transmit a first level of the first voltage terminal to the second node and a second output terminal in response to the level of the first node, and to transmit a second level of the second voltage terminal to the second node and the second output terminal in response to the level of the first node, wherein the second node is connected to the second output terminal.

2. The shift register according to claim 1, further comprising a control circuit,
wherein the control circuit is connected to the first node, the second node, the first voltage terminal, the first output terminal, and the third output terminal, and is configured to transmit the first level of the first voltage terminal to the first node, the first output terminal, and the third output terminal in response to a level of the second node.

3. The shift register according to claim 2, further comprising a reset circuit,
wherein the reset circuit is connected to the first voltage terminal, the first node, and the first output terminal, and is configured to transmit the first level of the first voltage terminal to the first node and the first output terminal in response to a reset signal.

4. The shift register according to claim 1, wherein the second output circuit comprises a seventh transistor, an eighth transistor, a ninth transistor, and a tenth transistor;
a control electrode of the seventh transistor and a first electrode of the seventh transistor are both connected to the second voltage terminal;
a control electrode of the eighth transistor is connected to a second electrode of the seventh transistor, a first electrode of the eighth transistor is connected to the second voltage terminal, and a second electrode of the eighth transistor is connected to the second node;
a control electrode of the ninth transistor is connected to the first node, a first electrode of the ninth transistor is connected to the second electrode of the seventh transistor, and a second electrode of the ninth transistor is connected to the first voltage terminal; and
a control electrode of the tenth transistor is connected to the first node, a first electrode of the tenth transistor is connected to the second node, and a second electrode of the tenth transistor is connected to the first voltage terminal.

5. The shift register according to claim 1, wherein the first output circuit comprises a third transistor, an eleventh transistor, and a first capacitor;
a control electrode of the third transistor is connected to the first node, a first electrode of the third transistor is connected to a clock terminal for receiving the clock signal, and a second electrode of the third transistor is connected to the first output terminal;
a control electrode of the eleventh transistor is connected to the first node, a first electrode of the eleventh transistor is connected to the clock terminal for receiving the clock signal, and a second electrode of the eleventh transistor is connected to the third output terminal; and
a first terminal of the first capacitor is connected to the first node, and a second terminal of the first capacitor is connected to the first output terminal.

6. The shift register according to claim 1, wherein the input circuit comprises a first transistor,
a control electrode of the first transistor and a first electrode of the first transistor are respectively connected to an input terminal for receiving the input signal, and a second electrode of the first transistor is connected to the first node.

7. The shift register according to claim 2, wherein the control circuit comprises a fifth transistor, a sixth transistor, and a twelfth transistor;
a control electrode of the fifth transistor is connected to the second node, a first electrode of the fifth transistor is connected to the first node, and a second electrode of the fifth transistor is connected to the first voltage terminal;
a control electrode of the sixth transistor is connected to the second node, a first electrode of the sixth transistor is connected to the first output terminal, and a second electrode of the sixth transistor is connected to the first voltage terminal; and
a control electrode of the twelfth transistor is connected to the second node, a first electrode of the twelfth transistor is connected to the third output terminal, and a second electrode of the twelfth transistor is connected to the first voltage terminal.

8. The shift register according to claim 3, wherein the reset circuit comprises a second transistor and a fourth transistor;
a control electrode of the second transistor is connected to a reset terminal for receiving the reset signal, a first electrode of the second transistor is connected to the first node, and a second electrode of the second transistor is connected to the first voltage terminal; and
a control electrode of the fourth transistor is connected to the reset terminal for receiving the reset signal, a first electrode of the fourth transistor is connected to the first output terminal, and a second electrode of the fourth transistor is connected to the first voltage terminal.

9. The shift register according to claim 3,
wherein the input circuit comprises a first transistor, a control electrode of the first transistor and a first electrode of the first transistor are respectively connected to an input terminal for receiving the input signal, and a second electrode of the first transistor is connected to the first node;
the first output circuit comprises a third transistor, an eleventh transistor, and a first capacitor, a control electrode of the third transistor is connected to the first node, a first electrode of the third transistor is connected to a clock terminal for receiving the clock signal, a second electrode of the third transistor is connected to the first output terminal, a control electrode of the eleventh transistor is connected to the first node, a first electrode of the eleventh transistor is connected to the clock terminal for receiving the clock signal, a second electrode of the eleventh transistor is connected to the third output terminal, a first terminal of the first capacitor is connected to the first node, and a second terminal of the first capacitor is connected to the first output terminal;
the second output circuit comprises a seventh transistor, an eighth transistor, a ninth transistor and a tenth transistor, and a control electrode of the seventh transistor and a first electrode of the seventh transistor are respectively connected to the second voltage terminal, a control electrode of the eighth transistor is connected to a second electrode of the seventh transistor, a first electrode of the eighth transistor is connected to the second voltage terminal, a second electrode of the eighth transistor is connected to the second node, a control electrode of the ninth transistor is connected to the first node, a first electrode of the ninth transistor is connected to the second electrode of the seventh transistor, a second electrode of the ninth transistor is connected to the first voltage terminal, a control electrode of the tenth transistor is connected to the first node, a first electrode of the tenth transistor is connected to the second node, and a second electrode of the tenth transistor is connected to the first voltage terminal;
the control circuit comprises a fifth transistor, a sixth transistor, and a twelfth transistor, and a control electrode of the fifth transistor is connected to the second node, a first electrode of the fifth transistor is connected to the first node, a second electrode of the fifth transistor is connected to the first voltage terminal, a control electrode of the sixth transistor is connected to the second node, a first electrode of the sixth transistor is connected to the first output terminal, a second electrode of the sixth transistor is connected to the first voltage terminal, a control electrode of the twelfth transistor is connected to the second node, a first electrode of the twelfth transistor is connected to the third output terminal, and a second electrode of the twelfth transistor is connected to the first voltage terminal;
the reset circuit comprises a second transistor and a fourth transistor, and a control electrode of the second transistor is connected to a reset terminal for receiving the reset signal, a first electrode of the second transistor is connected to the first node, a second electrode of the second transistor is connected to the first voltage terminal, a control electrode of the fourth transistor is connected to the reset terminal for receiving the reset signal, a first electrode of the fourth transistor is connected to the first output terminal, and a second electrode of the fourth transistor is connected to the first voltage terminal.

10. A gate driving circuit, comprising N cascaded shift registers according to claim 1,
wherein N is an integer greater than or equal to 3, a third output terminal of a $m^{th}$ shift register of the N shift registers is connected to a $(m+2)^{th}$ shift register of the N shift registers for providing the input signal, and m is an integer and $1 \leq m \leq N-2$; and
a $n^{th}$ shift register of the N shift registers is connected to a third output terminal of a $(n+2)^{th}$ shift register of the N shift registers for receiving a reset signal, and n is an integer and $1 \leq n \leq N-2$.

11. A gate driving circuit, comprising N cascaded shift registers according to claim 3,
wherein N is an integer greater than or equal to 3, a third output terminal of a $m^{th}$ shift register of the N shift registers is connected to a $(m+2)^{th}$ shift register of the N shift registers for providing the input signal, and m is an integer and $1 \leq m \leq N-2$; and
a $n^{th}$ shift register of the N shift registers is connected to a third output terminal of a $(n+2)^{th}$ shift register of the N shift registers for receiving the reset signal, and n is an integer and $1 \leq n \leq N-2$.

12. A display device, comprising the gate driving circuit according to claim 10.

13. A display device, comprising the gate driving circuit according to claim 11.

14. The display device according to claim 12, further comprising a plurality of row scanning signal lines and a plurality of control signal lines,
   wherein a first output terminal of each shift register in the gate driving circuit is connected to one of the plurality of row scanning signal lines, and a second output terminal of each shift register in the gate driving circuit is connected to one of the plurality of control signal lines.

15. The display device according to claim 14, further comprising a plurality of pixel units arranged in an array, and the array comprising a plurality of rows and a plurality of columns.

16. The display device according to claim 15, wherein each of the pixel units comprises a pixel circuit including a first switching transistor, a second switching transistor, a third switching transistor, a fourth switching transistor, a second capacitor, and a light emitting element;
   a control electrode of the first switching transistor is connected to one of the plurality of row scanning signal lines, a first electrode of the first switching transistor is connected to a control electrode of the second switching transistor, and a second electrode of the first switching transistor is connected to a third node;
   a first electrode of the second switching transistor is connected to a first voltage source, and a second electrode of the second switching transistor is connected to a fourth node;
   a control electrode of the third switching transistor is connected to the control electrode of the first switching transistor, a first electrode of the third switching transistor is connected to the third node, and a second electrode of the third switching transistor is connected to a data signal line;
   a control electrode of the fourth switching transistor is connected to one of the plurality of control signal lines, a first electrode of the fourth switching transistor is connected to the light emitting element, and a second electrode of the fourth switching transistor is connected to a second voltage source;
   a first terminal of the second capacitor is connected to the control electrode of the second switching transistor, and a second terminal of the second capacitor is connected to the first electrode of the second switching transistor; and
   a first electrode of the light emitting element is connected to the first electrode of the fourth switching transistor, and a second electrode of the light emitting element is connected to the fourth node.

17. The display device according to claim 16, wherein the light emitting element comprises an organic light emitting diode.

18. The display device according to claim 16, wherein the display device comprises an active matrix organic light emitting diode display device.

19. A method of driving a shift register according to claim 1, comprising:
   in a first stage, when the input signal is at a second level, making the input circuit transmit the input signal to the first node, and when the level of the first node is the second level, making the first output circuit transmit a first level of the received clock signal to the first output terminal and the third output terminal, and making the second output circuit transmit the first level of the first voltage terminal to the second node and the second output terminal;
   in a second stage, when the level of the first node is the second level, making the first output circuit transmit a second level of the received clock signal to the first output terminal and the third output terminal; and
   in a third stage, when the level of the first node is a first level, making the second output circuit transmit the second level of the second voltage terminal to the second node and the second output terminal.

20. A method of driving a shift register according to claim 3, comprising:
   in a first stage, when the input signal is at a second level, making the input circuit transmit the input signal to the first node, and when the level of the first node is the second level, making the first output circuit transmit a first level of the received clock signal to the first output terminal and the third output terminal, and making the second output circuit transmit the first level of the first voltage terminal to the second node and the second output terminal;
   in a second stage, when the level of the first node is the second level, making the first output circuit transmit a second level of the received clock signal to the first output terminal and the third output terminal; and
   in a third stage, when the reset signal is at the second level, making the reset circuit transmit the first level of the first voltage terminal to the first output terminal and the first node, when the level of the first node is a first level, making the second output circuit transmit the second level of the second voltage terminal to the second node and the second output terminal, and when the level of the second node is the second level, making the control circuit transmit the first level of the first voltage terminal to the first node, the first output terminal, and the third output terminal.

* * * * *